(12) United States Patent
Osuga et al.

(10) Patent No.: US 11,614,477 B2
(45) Date of Patent: Mar. 28, 2023

(54) INSPECTION DEVICE AND METHOD FOR OPERATING INSPECTION DEVICE

(71) Applicant: Tokyo Electron Limited, Tokyo (JP)

(72) Inventors: Yasuhiro Osuga, Yamanashi (JP); Koju Yamamoto, Hsin-chu (TW)

(73) Assignee: Tokyo Electron Limited, Tokyo (JP)

( * ) Notice: Subject to any disclaimer, the term of this patent is extended or adjusted under 35 U.S.C. 154(b) by 283 days.

(21) Appl. No.: 16/975,506

(22) PCT Filed: Feb. 13, 2019

(86) PCT No.: PCT/JP2019/005134
§ 371 (c)(1),
(2) Date: Aug. 25, 2020

(87) PCT Pub. No.: WO2019/163608
PCT Pub. Date: Aug. 29, 2019

(65) Prior Publication Data
US 2021/0132135 A1 May 6, 2021

(30) Foreign Application Priority Data
Feb. 26, 2018 (JP) .............................. JP2018-032363

(51) Int. Cl.
*G01R 31/26* (2020.01)
*G01N 25/68* (2006.01)

(52) U.S. Cl.
CPC ......... *G01R 31/2601* (2013.01); *G01N 25/68* (2013.01)

(58) Field of Classification Search
CPC ............ G01R 31/2601; G01R 31/2875; G01R 31/2877; G01R 31/2881; G01R 31/2862;
(Continued)

(56) References Cited

U.S. PATENT DOCUMENTS

2005/0227503 A1  10/2005  Reitinger
2013/0077651 A1   3/2013  Lee

FOREIGN PATENT DOCUMENTS

JP    2002231777 A  *  8/2002  ......... G01R 31/2862
JP    2005-528781        9/2005
(Continued)

OTHER PUBLICATIONS

Translation of Ishizaka, JP2002231777A (Year: 2002).*
Translation of Kashirajima, JP2008284482A (Year: 2008).*
Translation of Mogi, JP2009105339A (Year: 2009).*

*Primary Examiner* — Yoshihisa Ishizuka
*Assistant Examiner* — Christopher J Gassen
(74) *Attorney, Agent, or Firm* — IPUSA, PLLC

(57) ABSTRACT

An inspection device according to an embodiment can conduct high temperature inspection and low temperature inspection on an object to be inspected. The inspection device includes an inspection chamber in which inspection is conducted on the object; a dry air supply section that is connected to the inspection chamber via a first valve and that is configured to supply dry air into the inspection chamber; a dew point meter that is connected to the inspection chamber via a second valve and that is configured to measure a dew point in the inspection chamber; and a bypass pipe connecting the dry air supply section and the dew point meter via a third valve.

8 Claims, 4 Drawing Sheets

(58) Field of Classification Search
CPC ........ G01R 1/073; G01N 25/68; G01N 25/66; H01L 22/30; H01L 22/14; F16K 37/005
See application file for complete search history.

(56) References Cited

FOREIGN PATENT DOCUMENTS

| | | | | |
|---|---|---|---|---|
| JP | 2008284482 A | * | 11/2008 | ......... G01R 31/2601 |
| JP | 2009105339 A | * | 5/2009 | |
| JP | 2010-087090 | | 4/2010 | |
| KR | 10-2013-0032647 | | 4/2013 | |

* cited by examiner

INSPECTION DEVICE AND METHOD FOR OPERATING INSPECTION DEVICE

TECHNICAL FIELD

The present invention relates to an inspection device and a method of operating the inspection device.

BACKGROUND

Conventionally, an inspection device including a prober chamber is known, in which an object to be inspected placed on a stage is adjusted to a predetermined temperature in a low temperature range to conduct electrical characteristic inspection on the object (see Patent Document 1, for example). In order to prevent occurrence of dew condensation in the prober chamber, the inspection device maintains the interior of the prober chamber at a dew point suitable for low temperature inspection, by constantly supplying dry air into the prober chamber and by monitoring the dew point in the prober chamber with a dew point meter provided in the prober chamber.

RELATED ART DOCUMENTS

Patent Document

[Patent Document 1] Japanese Laid-open Patent Application Publication No. 2010-087090

SUMMARY

Problem to be Solved by the Invention

However, the aforementioned device consumes a large amount of dry air because dry air is continuously supplied into the prober chamber.

Accordingly, it is an object of one aspect of the present invention to provide an inspection device capable of reducing consumption of dry air.

Means for Solving Problem

In order to achieve the above-described object, an inspection device according to one aspect of the present invention can conduct high temperature inspection and low temperature inspection on an object to be inspected. The inspection device includes an inspection chamber in which inspection is conducted on the object; a dry air supply section that is connected to the inspection chamber via a first valve and that is configured to supply dry air into the inspection chamber; a dew point meter that is connected to the inspection chamber via a second valve and that is configured to measure a dew point in the inspection chamber; and a bypass pipe connecting the dry air supply section and the dew point meter via a third valve.

Effect of Invention

According to the disclosed inspection device, dry air consumption can be reduced.

DESCRIPTION OF EMBODIMENTS

Figure 1:
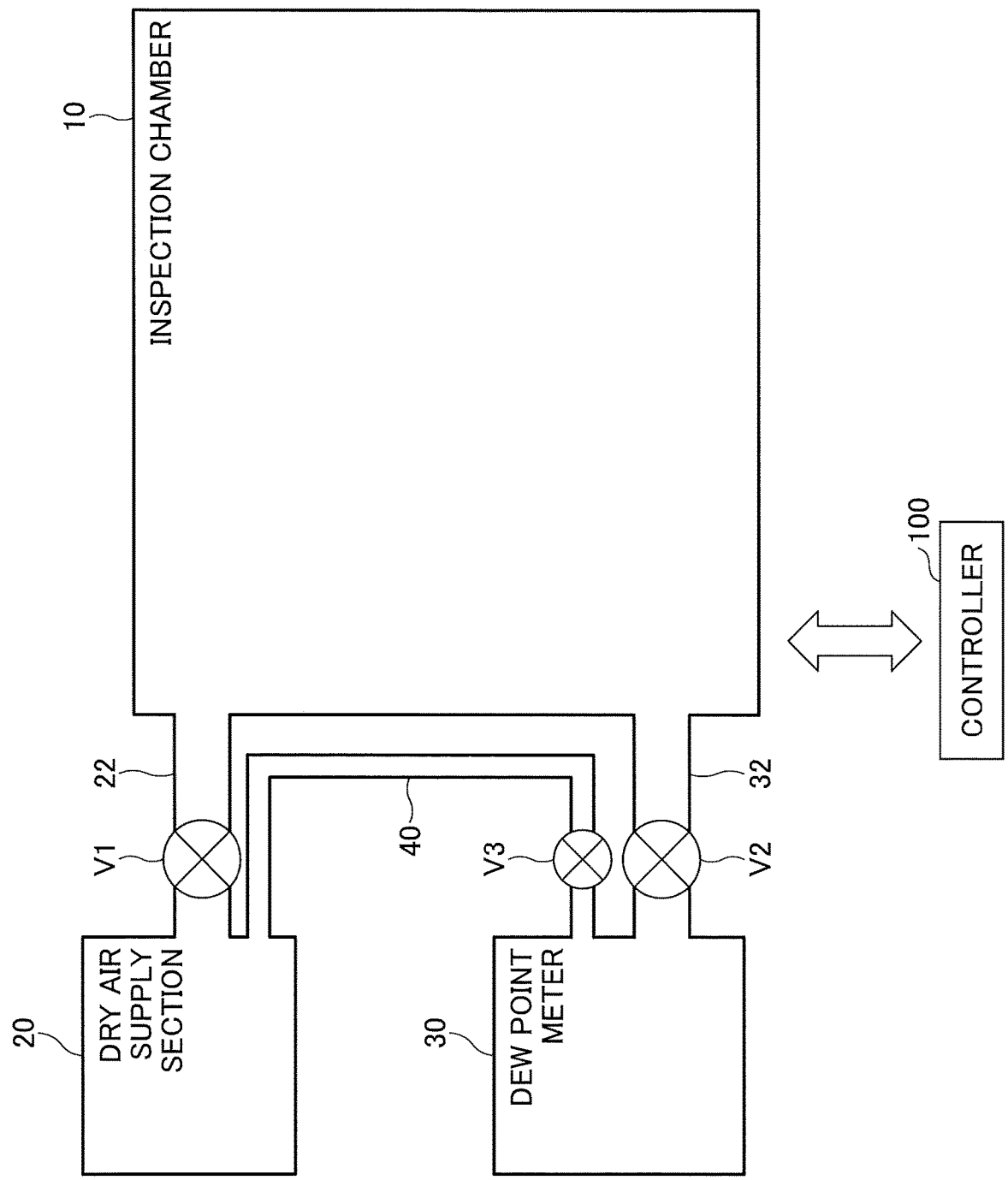
FIG. 1 is a schematic diagram illustrating an example of a prober device according to an embodiment of the present invention.

Hereinafter, embodiments for carrying out the present invention will be described with reference to the drawings. In the present specification and drawings, substantially same structures are indicated by the same reference numerals, and redundant descriptions may be omitted.

Prober Device

As an example of an inspection device according to an embodiment of the present invention, a prober device will be described. FIG. 1 is a schematic diagram illustrating an example of the prober device according to the embodiment of the present invention.

As illustrated in FIG. 1, the prober device 1 according to the embodiment of the present invention includes an inspection chamber 10, a dry air supply section 20, a dew point meter 30, a bypass pipe 40, and a controller 100.

The inspection chamber 10 is a chamber that accommodates a semiconductor wafer, which is an object to be inspected, and that carries out electrical characteristic inspection of the semiconductor wafer. The inspection chamber 10 is constructed to airtight. The electrical characteristic inspection includes low temperature inspection, normal temperature inspection, and high temperature inspection. The low temperature inspection refers to an inspection in which the temperature in the inspection chamber 10 is adjusted to a low temperature less than 20° C. (e.g., −60° C. or −70° C.) to measure electrical characteristics of a semiconductor wafer. The normal temperature Inspection refers to an inspection in which the temperature in the inspection chamber 10 is adjusted to a temperature higher than or equal to 20° C. and lower than 50° C. to measure electrical characteristics of a semiconductor wafer. The high temperature inspection refers to an inspection in which the temperature in the inspection chamber 10 is adjusted to 50° C. or higher to measure electrical characteristics of a semiconductor wafer.

Inside the inspection chamber 10, a stage for placing a semiconductor wafer, a probe card disposed above the stage and having multiple probes, and an alignment mechanism for aligning multiple electrode pads of a semiconductor wafer on the stage with the multiple probes, are provided. The inspection chamber 10 is configured to carry out electrical characteristic inspection of each device on a semiconductor wafer, after alignment of multiple electrode pads of a semiconductor wafer with the multiple probes of the probe card, in cooperation with the stage and the alignment mechanism under the control of the controller 100.

The dry air supply section 20 is connected to the inspection chamber 10 via a pipe 22 to supply dry air into the inspection chamber 10. The pipe 22 is provided with a valve V1, which is a first valve. The valve V1 may be, for example, a solenoid valve, and opening and closing operations of the valve V1 are controlled by the controller 100. For example, when the valve V1 is controlled to an open state, the dry air supply section 20 communicates with the interior of the inspection chamber 10, and dry air is supplied from the dry air supply section 20 to the inside of the inspection chamber 10. Conversely, when the valve V1 is controlled to a closed state, communication between the dry air supply section 20 and the interior of the inspection chamber 10 is interrupted, and the supply of dry air from the dry air supply section 20 to the inside of the inspection chamber 10 is stopped.

The dew point meter 30 is connected to the inspection chamber 10 via a pipe 32 to measure the dew point in the inspection chamber 10. The pipe 32 is provided with the valve V2, which is a second valve. The valve V2 is, for example, a solenoid valve, and opening and closing operations of the valve V2 are controlled by the controller 100. For example, when the valve V2 is controlled to an open state, the dew point meter 30 communicates with the interior of the inspection chamber 10, and gas in the inspection chamber 10 is supplied to the dew point meter 30 so that the dew point in the inspection chamber 10 can be measured by the dew point meter 30. Conversely, when the valve V2 is controlled to a closed state, communication between the dew point meter 30 and the interior of the inspection chamber 10 is interrupted, and the supply of gas from the inspection chamber 10 to the dew point meter 30 is stopped, the dew point meter 30 may be, for example, a capacitive dew point meter or a chilled mirror dew point meter.

The bypass pipe 40 is a bypass line that directly connects the dry air supply section 20 and the dew point meter 30 without passing through the inspection chamber 10. The bypass pipe 40 has a diameter smaller than, for example, the pipe 22 and the pipe 32. The bypass pipe 40 is provided with a valve V3, which is a third valve. The valve 73 may be, for example, a solenoid valve, and opening and closing operations of the valve V3 are controlled by the controller 100. For example, when the valve V3 is controlled to an open state, the dry air supply section 20 communicates with the dew point meter 30, and dry air is supplied from the dry air supply section 20 to the dew point meter 30 without passing through the inspection chamber 10. Conversely, when the valve V3 is controlled to a closed state, communication between the dry air supply section 20 and the dew point meter 30 is interrupted, and the supply of dry air from the dry air supply section 20 to the dew point meter 30 is stopped.

The controller 100 controls operations of each part of the prober device 1. For example, the controller 100 controls opening and closing operations of the valves V1, V2, and V3, in accordance with types of inspection (e.g., low temperature inspection, normal temperature inspection, and high temperature inspection) to be conducted on a semiconductor wafer in the inspection chamber 10. Specifically, for example, in a case in which the low temperature inspection or the normal temperature inspection is conducted on a semiconductor wafer in the inspection chamber 10, there is no risk of occurrence of dew condensation in the inspection chamber 10. Accordingly, the controller 100 controls the opening and closing operations of the valves V1, V2, and V3 so as to supply dry air from the dry air supply section 20 to the dew point meter 30 via the bypass pipe 40, without supplying dry air from the dry air supply section 20 into the inspection chamber 10. Also, for example, when a status of the inspection chamber 10 is switched, from a state in which the normal temperature inspection or the high temperature inspection can be conducted on a semiconductor wafer in the inspection chamber 10 to a state in which the low temperature inspection can be conducted, the opening and closing operations of the valves V1, V2, and V3 are controlled, such that dry air is supplied into the inspection chamber 10 until the dew point in the inspection chamber 10 is stabilized to a level at which dew condensation does not occur, and that the dry air having been supplied in the inspection chamber 10 is supplied to the dew point meter 30 connected to the inspection chamber 10 after the dew point in the inspection chamber 10 becomes stable. Also, for example, when the low temperature inspection is conducted on a semiconductor wafer in the inspection chamber 10, the controller 100 controls the opening and closing operations of the valves V1, V2, and V3 to supply dry air from the dry air supply section 20 to the dew point meter 30 through the inspection chamber 10.

FIG. 1 illustrates a case in which the valves V1, V2, and V3 are interposed in the pipe 22, the pipe 32, and the bypass pipe 40 respectively. However, the valves V2 and V3 may be configured by a single valve, for example. If two valves are configured by a single valve, a three-way valve may be used for example.

Operation of Prober Device

An example of the operation of the prober device 1 according to the embodiment of the present invention will be described. The operation of the prober device 1 described below is controlled by the controller 100.

Figure 2:
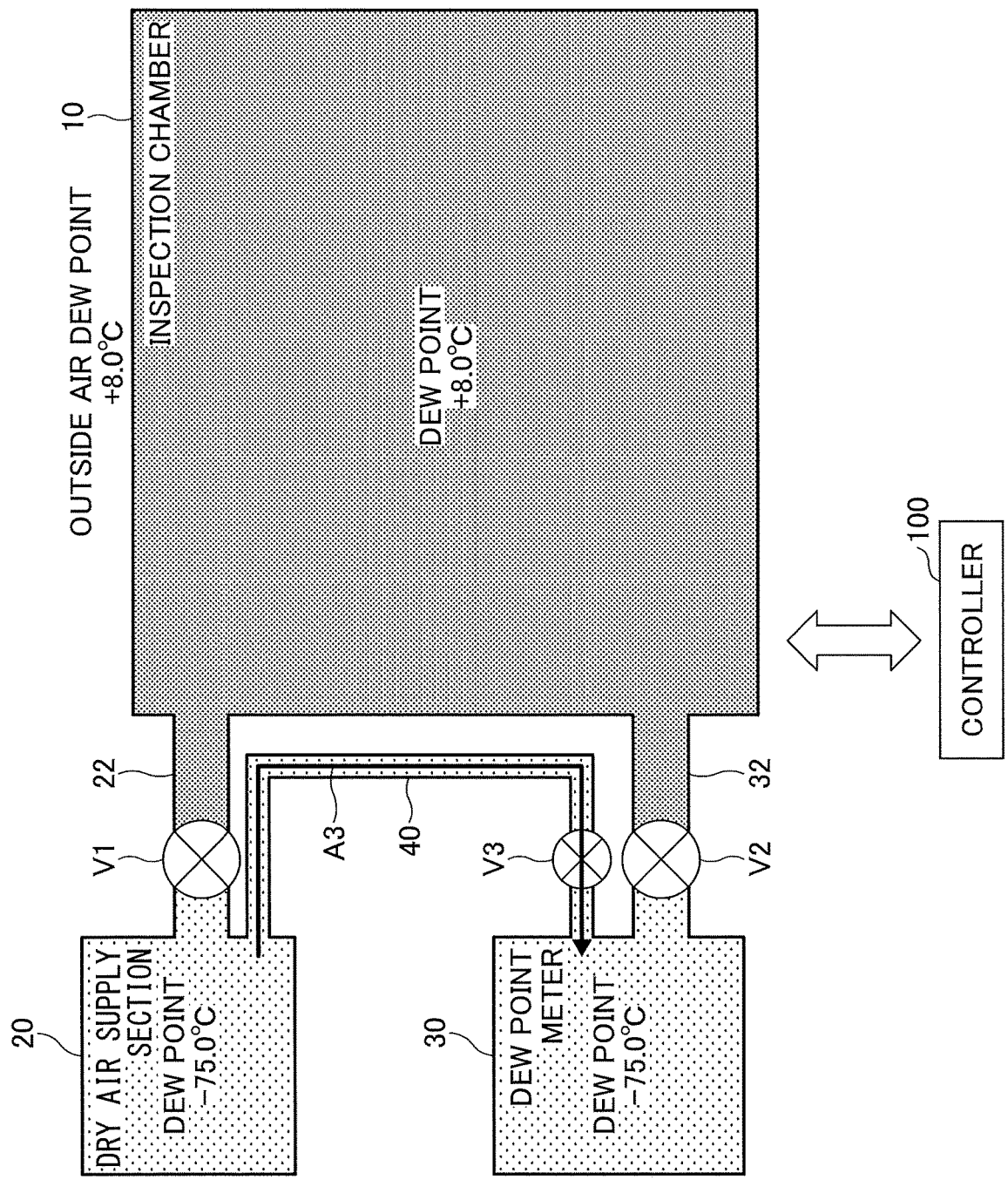
FIG. 2 is a diagram illustrating a state of the prober device when normal temperature inspection or high temperature inspection is conducted.

First, with reference to FIG. 2, a case of conducting the normal temperature inspection or the high temperature inspection in the inspection chamber 10, under an environment of an outside air dew point of +8.0° C., is described. The dew point of dry air supplied from the dry air supply section 20 is, for example, −75° C. FIG. 2 is a diagram illustrating a state of the prober device 1 when the normal temperature inspection or the high temperature inspection is conducted.

When the normal temperature inspection or the high temperature inspection is conducted on a semiconductor wafer in the inspection chamber 10, the controller 100 controls opening and closing operations of the valves V1, V2, and V3 to supply dry air from the dry air supply section 20 to the dew point meter 30 via the bypass pipe 40, without supplying the dry air from the dry air supply section 20 to the inspection chamber 10. In the present embodiment, the controller 100 controls the valves such that the valve V1 is in a closed state, the valve V2 is in a closed state, and the valve V3 is in an open state. By controlling the valves as described above, communication between the dry air supply section 20 and the inspection chamber 10 is interrupted, communication between the inspection chamber 10 and the dew point meter 30 is interrupted, and the dry air supply section 20 communicates with the dew point meter 30. As a result, dry air is supplied from the dry air supply section 20 to the dew point meter 30 via the bypass pipe 40 without passing through the inspection chamber 10 (see the arrow A3 in FIG. 2).

At this time, because the capacity of the bypass pipe 40 is small compared to the capacity of the inspection chamber 10, dry air consumption can be reduced. In addition, as the dew point meter 30 continues to receive dry air of a low dew point (e.g., −75° C.) from the dry air supply section 20, the dew point meter 30 maintains a dry state. Meanwhile, because dry air is not supplied into the inspection chamber 10 from the dry air supply section 20, the dew point in the inspection chamber 10 gradually increases over time due to natural leaks or the like, and may reach the outside air dew point. Even in such a case, because the temperature in the inspection chamber 10 is higher than the outside air dew point when the normal temperature inspection or the high temperature inspection is conducted, the inspection can be conducted without condensation in the inspection chamber 10.

Figure 3:
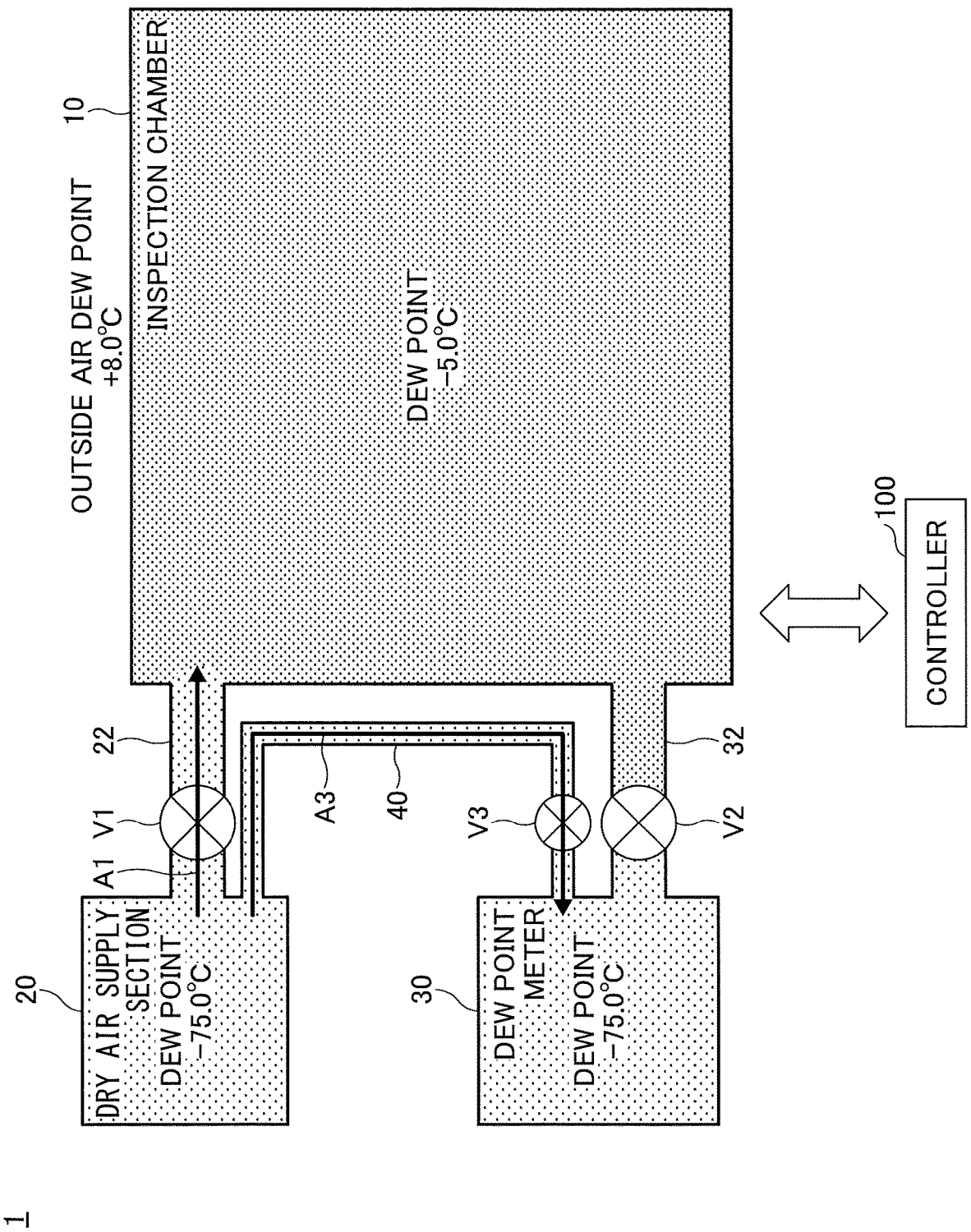
FIG. 3 is a diagram illustrating a state of the prober device when switching from normal/high temperature inspection to low temperature inspection.
Figure 4:
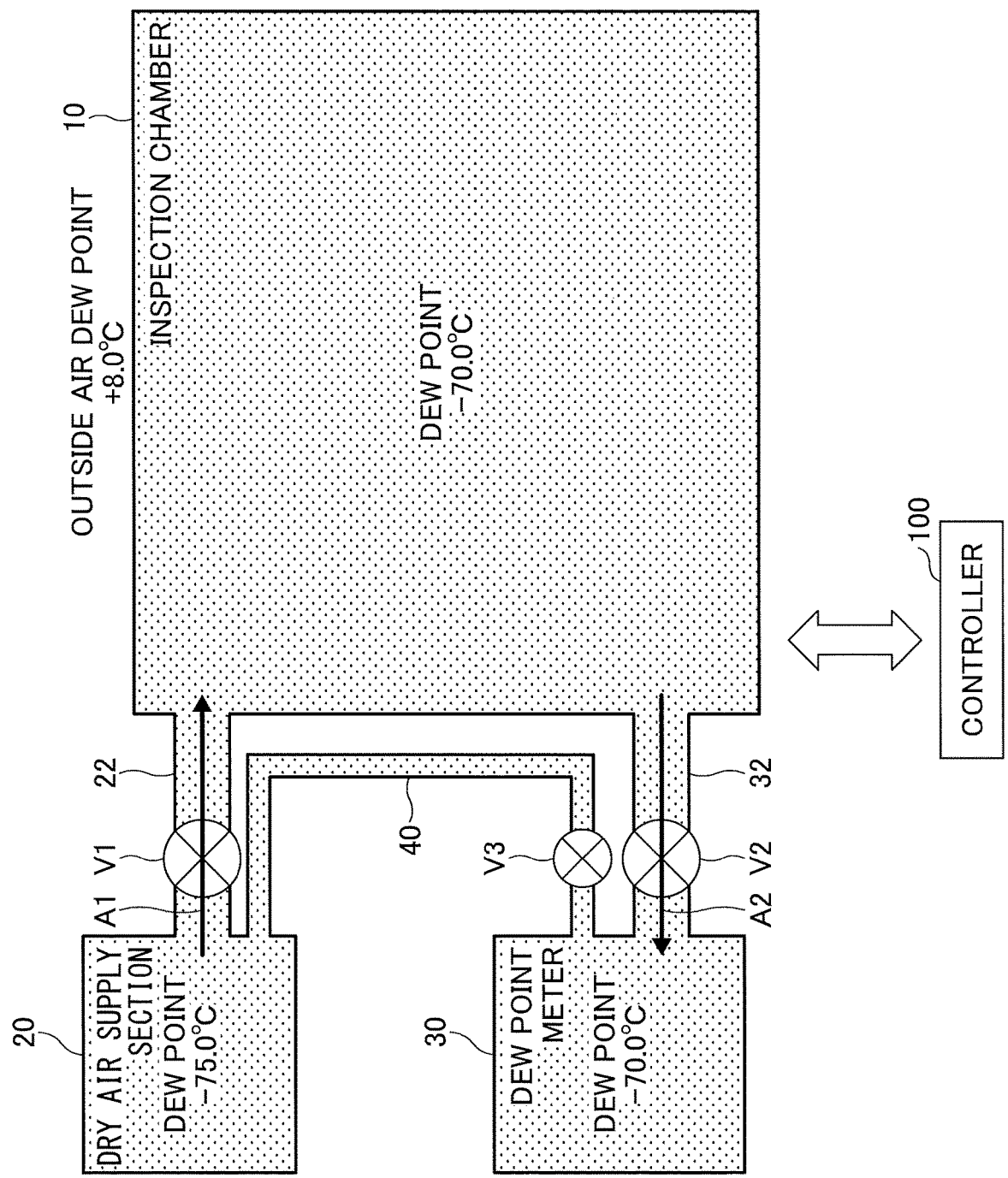
FIG. 4 is a diagram illustrating a state of the prober device when the low temperature inspection is conducted.

Next, with reference to FIGS. 3 and 4, a case of switching the status of the inspection chamber 10 will be described, from a state in which the normal temperature inspection or the high temperature inspection can be conducted on a semiconductor wafer to a state in which the low temperature inspection can be conducted, under an environment in which the outside air dew point is +8.0° C. The dew point of dry air supplied from the dry air supply section 20 is −75° C., for example. FIG. 3 is a diagram illustrating a state of the prober device 1 when switching from the normal/high temperature inspection to the low temperature inspection.

When the status of the inspection chamber 10 is switched from a state in which the normal temperature Inspection or the high temperature inspection can be conducted on a semiconductor wafer in the inspection chamber 10 to a state in which the low temperature inspection can be conducted, the controller 100 supplies dry air into the inspection chamber 10 until the dew point in the inspection chamber 10 is stabilized to a level at which dew condensation does not occur. After the dew point in the inspection chamber 10 becomes stable, the controller 100 controls the opening/closing operations of the valves V1, V2, and V3 to supply the dry air having been supplied in the inspection chamber 10 to the dew point meter 30 connected to the inspection chamber 10. In the present embodiment, the controller 100 first switches the valve V1 from a closed state to an open state while the valve V2 is maintained in a closed state and the valve V3 is maintained in an open state. Thus, dry air is supplied from the dry air supply section 20 to the inspection chamber 10 (see the arrow A1 in FIG. 3) while a state in which dry air is supplied from the dry air supply section 20 to the dew point meter 30 via the bypass pipe 40 is maintained (see the arrow A3 in FIG. 3). Then, after the dew point in the inspection chamber 10 becomes stable, the controller 100 switches the valve V2 to an open state and switches the valve V3 to a closed state. Thus, the dry air having been supplied from the dry air supply section 20 in the inspection chamber 10 is supplied to the dew point meter 30 (see the arrows A1 and A2 in FIG. 4). Whether the dew point in the inspection chamber 10 becomes stable can be determined based on, for example, whether a predetermined period of time has elapsed since the valve V1 was switched from the closed state to the open state. The predetermined period of time may be determined by, for example, calculating the relationship between an elapsed time since the valve V1 was switched from a closed state to an open state and the dew point in the inspection chamber 10, in advance. Alternatively, whether the dew point in the inspection chamber 10 becomes stable may be determined by installing a dew point meter, other than the dew point meter 30, which is capable of measuring a dew point in the inspection chamber 10, and by measuring the dew point in the inspection chamber 10 by the installed dew point meter.

As described above, because dry air in the inspection chamber 10 is supplied to the dew point meter 30 after the dew point in the inspection chamber 10 becomes stable, it is possible to suppress condensation of the dew point meter 30 when switching from a state in which the normal temperature inspection or the high temperature inspection can be conducted to a state in which the low temperature inspection can be conducted.

Next, a case in which the low temperature inspection is conducted in the inspection chamber 10 under the environment in which the outside air dew point is +8.0° C. will be described with reference to FIG. 4. The dew point of dry air supplied from the dry air supply section 20 is −75° C., for example. FIG. 4 is a diagram illustrating a state of the prober device 1 when the low temperature inspection is conducted.

When the low temperature inspection is conducted on a semiconductor wafer in the inspection chamber 10, the controller 100 controls opening and closing operations of the valves V1, V2, and V3 so as to supply dry air from the dry air supply section 20 to the dew point meter 30 via the inspection chamber 10. In the present embodiment, the controller 100 controls the valves V1, V2, and V3 such that the valve V1 is in an open state, the valve V2 is in an open state, and the valve V3 is in a closed state. Thus, dry air is supplied from the dry air supply section 20 into the inspection chamber 10 (see the arrow A1 in FIG. 4), and the dry air in the inspection chamber 10 is supplied to the dew point meter 30 (see the arrow A2 in FIG. 4). Therefore, the dew point in the inspection chamber 10 can be measured by the dew point meter 30.

A capacitive dew point meter is used as the dew point meter 30 in many cases, because the capacitive dew point meter is inexpensive and the size of the capacitive dew point meter is small. However, due to the measurement principle of a capacitive dew point meter, moisture easily adheres to the capacitive dew point meter, and is not removed easily. Therefore, in a case of measuring gas of a low dew point (e.g., −50° C.) using a capacitive dew point meter after measuring gas of a high dew point (e.g., +20° C.), it takes a long time (e.g., a few days) until the capacitive dew point meter becomes able to accurately measure a dew point.

However, according to the embodiment of the present invention, not only in a case of conducting the low temperature inspection but also in a case of conducting the normal temperature inspection or the high temperature inspection, dry air with a low dew point is always supplied to the dew point meter 30. Therefore, even if a capacitive dew point meter is used, the low temperature inspection can be conducted in a short time after the status of the inspection chamber 10 is switched from a state in which the normal temperature inspection or the high temperature inspection can be conducted on a semiconductor wafer in the inspection chamber 10 to a state in which the low temperature inspection can be conducted.

As described above, in the inspection device according to the embodiment of the present invention, the dew point meter 30 is connected to the inspection chamber 10 via the pipe 32 interposed with the valve V2, and is connected to the dry air supply section 20 via the bypass pipe 40 interposed with the valve V3. Accordingly, the dew point meter 30 can be set to a standby state by constantly supplying dry air to the dew point meter 30 through the bypass pipe 40 when the normal temperature inspection or the high temperature inspection is conducted, and dry air can be supplied to the inside of the inspection chamber 10 only when the low temperature measurement is conducted. In a conventional device, even in a case of conducting the normal temperature inspection or the high temperature inspection, dry air was supplied to the inspection chamber 10, and the dry air is supplied to the dew point meter 30 through the pipe 32 to set the dew point meter 30 to a standby state. Thus, a large amount of dry air was consumed. However, in the inspection device according to the embodiment of the present invention, dry air consumption can be reduced significantly.

Although the embodiment of the present invention has been described above, the above description is not intended to limit contents of the invention. Various modifications and enhancements can be made within the scope of the present invention.

This international application is based on and claims priority to Japanese Patent Application No. 2018-032363, filed on Feb. 26, 2018, the entire contents of which are incorporated herein by reference.

DESCRIPTION OF SYMBOLS

1 Prober device
10 Inspection chamber
20 Dry air supply section
22 Pipe
30 Dew point meter
32 Pipe
40 Bypass pipe
100 Controller
V1 Valve
V2 Valve
V3 Valve

What is claimed is:

1. An inspection device comprising:
an inspection chamber in which inspection is conducted on an object to be inspected;
a dry air supply section connected to the inspection chamber via a first valve, the dry air supply section being configured to supply dry air into the inspection chamber;
a dew point meter connected to the inspection chamber via a second valve, the dew point meter being configured to measure a dew point in the inspection chamber; and
a bypass pipe connecting the dry air supply section and the dew point meter via a third valve, and
a controller configured to control opening and closing operations of the first valve, the second valve, and the third valve, in accordance with a type of inspection conducted on the object to be inspected,
wherein the controller is configured to control the opening and closing operations of the first valve, the second valve, and the third valve, in order to supply the dry air from the dry air supply section to the dew point meter via the bypass pipe without supplying the dry air from the dry air supply section to the inspection chamber, based on a temperature in the inspection chamber.

2. The inspection device according to claim 1, wherein the controller controls the opening and closing operations of the first valve, the second valve, and the third valve, in order to supply the dry air from the dry air supply section to the dew point meter via the bypass pipe without supplying the dry air from the dry air supply section to the inspection chamber in response to detecting that the temperature in the inspection chamber is greater than or equal to 50° C.

3. An inspection device comprising:
an inspection chamber in which inspection is conducted on an object to be inspected;
a dry air supply section connected to the inspection chamber via a first valve, the dry air supply section being configured to supply dry air into the inspection chamber;
a dew point meter connected to the inspection chamber via a second valve, the dew point meter being configured to measure a dew point in the inspection chamber; and
a bypass pipe connecting the dry air supply section and the dew point meter via a third valve, a controller configured to control opening and closing operations of the first valve, the second valve, and the third valve, in accordance with a type of inspection conducted on the object to be inspected,
wherein the dew point meter is connected to the inspection chamber via a dew point meter pipe, and
wherein the controller is configured to control the opening and closing operations of the first valve, the second valve, and the third valve, in order to supply the dry air from the dry air supply section to the dew point meter via the dew point meter pipe by the dry air supply section supplying the dry air to the inspection chamber, based on a temperature in the inspection chamber.

4. The inspection device according to claim 3, wherein the controller controls the opening and closing operations of the first valve, the second valve, and the third valve, in order to supply the dry air from the dry air supply section to the dew point meter via the dew point meter pipe in response to detecting that the temperature in the inspection chamber is less than 20° C.

5. An inspection device comprising:
an inspection chamber in which inspection is conducted on an object to be inspected;
a dry air supply section connected to the inspection chamber via a first valve, the dry air supply section being configured to supply dry air into the inspection chamber;
a dew point meter connected to the inspection chamber via a second valve, the dew point meter being configured to measure a dew point in the inspection chamber; and
a bypass pipe connecting the dry air supply section and the dew point meter via a third valve, and
a controller configured to control opening and closing operations of the first valve, the second valve, and the third valve, in accordance with a type of inspection conducted on the object to be inspected,
wherein, in response to detecting that a temperature in the inspection chamber decreases, the controller is configured to control the opening and closing operations of the first valve, the second valve, and the third valve,
such that the dry air is supplied into the inspection chamber for a predetermined period of time, the predetermined period of time being determined based on a relationship between an elapsed time since the dry air is supplied into the inspection chamber and a dew point in the inspection chamber, and
such that the dry air having been supplied to the inspection chamber is supplied to the dew point meter connected to the inspection chamber, after the predetermined period of time has elapsed.

6. The inspection device according to claim 5, wherein the controller controls the opening and closing operations of the first valve, the second valve, and the third valve in response to detecting that the temperature in the inspection chamber decreases from 50° C. or greater to less than 20° C.

7. A method of operating an inspection device including an inspection chamber in which inspection is conducted on an object to be inspected, a dry air supply section connected to the inspection chamber via a first valve and configured to supply dry air into the inspection chamber, a dew point meter connected to the inspection chamber via a second valve and configured to measure a dew point in the inspection chamber, and a bypass pipe connecting the dry air supply section and the dew point meter via a third valve; the method comprising:

controlling opening and closing operations of the first valve, the second valve, and the third valve, in order to supply the dry air from the dry air supply section to the dew point meter via the bypass pipe, without supplying the dry air from the dry air supply section to the inspection chamber, based on a temperature in the inspection chamber.

8. The method according to claim 7, wherein the controlling of the opening and closing operations includes controlling the opening and closing operations of the first valve, the second valve, and the third valve, in order to supply the dry air from the dry air supply section to the dew point meter via the bypass pipe, without supplying the dry air from the dry air supply section to the inspection chamber in response to detecting that the temperature in the inspection chamber is greater than or equal to 50° C., to supply the dry air having been supplied to the inspection chamber to the dew point meter connected to the inspection chamber after the dew point in the inspection chamber becomes stable in response to detecting that the temperature in the inspection chamber is changed from 50° C. or greater to less than 20° C., and to supply the dry air from the dry air supply section to the dew point meter via the inspection chamber in response to detecting that the temperature in the inspection chamber is less than 20° C.

* * * * *